United States Patent [19]

Fukushima et al.

[11] Patent Number: 4,590,427

[45] Date of Patent: May 20, 1986

[54] NUCLEAR MAGNETIC RESONANCE APPARATUS HAVING SEMITOROIDAL RF COIL FOR USE IN TOPICAL NMR AND NMR IMAGING

[75] Inventors: Eiichi Fukushima, Los Alamos, N. Mex.; Stephen B. W. Roeder, La Mesa, Calif.; Roger A. Assink, Albuquerque, N. Mex.; Atholl A. V. Gibson, Bryan, Tex.

[73] Assignee: The United States of America as represented by the United States Department of Energy, Washington, D.C.

[21] Appl. No.: 479,581

[22] Filed: Mar. 28, 1983

[51] Int. Cl.$^4$ ............................................. G01R 33/20
[52] U.S. Cl. ..................................... 324/318; 324/311
[58] Field of Search ........ 324/300, 311, 309, 318–322; 128/1.5, 691, 653; 336/225, 228, 229; 335/213, 296, 297

[56] References Cited

U.S. PATENT DOCUMENTS

| Re. 23,769 | 1/1954 | Varian . | |
|---|---|---|---|
| 1,594,273 | 7/1926 | Sateren | 336/225 |
| 2,561,489 | 7/1951 | Bloch . | |
| 2,856,579 | 10/1958 | Packard . | |
| 2,999,978 | 9/1961 | Pinkley . | |
| 3,030,571 | 4/1962 | Dessler . | |
| 3,109,138 | 10/1963 | Varian . | |
| 3,238,484 | 3/1966 | Dacey | 336/228 |
| 3,242,424 | 3/1966 | Redfield | 324/322 |
| 3,287,630 | 11/1966 | Gang | 324/320 |
| 3,350,632 | 10/1967 | Robinson . | |
| 3,427,532 | 2/1969 | Nelson . | |
| 3,502,963 | 3/1970 | Hlavka . | |
| 3,795,855 | 3/1974 | Browning . | |
| 3,805,768 | 4/1974 | Barefoot | 128/691 |
| 3,886,440 | 5/1975 | Berry et al. . | |
| 3,932,805 | 1/1976 | Abe | 324/309 |
| 3,938,018 | 2/1976 | Dahl | 336/225 |
| 4,056,097 | 11/1977 | Maass | 128/1.5 |
| 4,095,168 | 6/1978 | Hlavka . | |
| 4,206,391 | 6/1980 | Varacins | 324/226 |
| 4,379,262 | 4/1983 | Young | 324/309 |

OTHER PUBLICATIONS

R. K. Cooper and J. A. Jackson, "Remote (Inside-Out) NMR. I. Remote Production of a Region of Homogeneous Magnetic Field," *Journal of Magnetic Resonance,* 41, 400–405 (1980).
L. J. Burnett and J. A. Jackson, "Remote (Inside-Out) NMR. II. Sensitivity of NMR Detection for External Samples," *Journal of Magnetic Resonance,* 41, 406–410.
J. A. Jackson et al., "Remote (Inside-Out) NMR. III. Detection of Nuclear Magnetic Resonance in a Remotely Produced Region of Homogeneous Magnetic Field," *Journal of Magnetic Resonance,* 41, 411–421 (1980).
R. E. Gordon et al., "Topical Magnetic Resonance," in *Progress in Nuclear Magnetic Resonance Spectroscopy,* Oxford Research Systems Ltd., 15, No. 1, pp. 1–47, (Pergamon Press 1982).
J. J. H. Ackerman et al., "Mapping of Metabolites in Whole Animals by $^{31}$p NMR Using Surface Coils," *Nature,* 283, 167–170 (Jan. 10, 1980).
R. G. Shulman, "NMR Spectroscopy of Living Cells," *Scientific American,* pp. 86–93 (Nov. 1982).

*Primary Examiner*—Michael J. Tokar
*Attorney, Agent, or Firm*—William A. Eklund; Paul D. Gaetjens; Judson R. Hightower

[57] ABSTRACT

An improved nuclear magnetic resonance (NMR) apparatus for use in topical magnetic resonance (TMR) spectroscopy and other remote sensing NMR applications includes a semitoroidal radio-frequency (rf) coil. The semitoroidal rf coil produces an effective alternating magnetic field at a distance from the poles of the coil, so as to enable NMR measurements to be taken from selected regions inside an object, particularly including human and other living subjects. The semitoroidal rf coil is relatively insensitive to magnetic interference from metallic objects located behind the coil, thereby rendering the coil particularly suited for use in both conventional and superconducting NMR magnets. The semitoroidal NMR coil can be constructed so that it emits little or no excess rf electric field associated with the rf magnetic field, thus avoiding adverse effects due to dielectric heating of the sample or to any other interaction of the electric field with the sample.

19 Claims, 15 Drawing Figures

NUCLEAR MAGNETIC RESONANCE APPARATUS HAVING SEMITOROIDAL RF COIL FOR USE IN TOPICAL NMR AND NMR IMAGING

BACKGROUND OF THE INVENTION

The invention disclosed herein is generally related to the analytical and diagnostic applications of nuclear magnetic resonance (NMR). More specifically, this invention is related to topical magnetic resonance (TMR) spectroscopy, NMR imaging, and other NMR applications. This invention is the result of a contract with the Department of Energy (Contract No. W-7405-ENG-36).

Topical magnetic resonance (TMR) spectroscopy and NMR imaging are variations of NMR spectroscopy in which an NMR signal is obtained from material located inside an object. In recent years the development of TMR spectroscopy and of closely related NMR imaging have greatly increased the applications of NMR in the fields of biology and medicine. Specifically, TMR has been shown to be useful as a non-invasive method of obtaining biochemical and physiological information from localized regions inside living animals, particularly including human subjects. In actual demonstrations of the method, specific metabolites have been identified, and from such information diseases and metabolic disorders have been diagnosed.

NMR spectroscopy has also been employed in a three-dimensional scanning mode to provide NMR imaging. Such imaging has been shown to be comparable with x-ray computer tomography (CT) imaging with respect to the quality of picture resolution that can be obtained. Unlike CT imaging, however, NMR imaging can distinguish regions having the same probe nucleus density but having different local molecular environments. The major advantage of both NMR and CT imaging is that the internal tissues of a live animal can be studied without resorting to surgery or otherwise disturbing the metabolism of the animal. NMR imaging offers an additional advantage over CT imaging techniques in that no ionizing x-ray radiation is employed.

In all NMR instruments, the sample or article to be analyzed is positioned in the static magnetic field of a large magnet. A radio-frequency (rf) coil irradiates the sample with an alternating magnetic field, which is absorbed at certain resonant frequencies that are characteristic of the chemical structure and composition of the sample. The absorbed energy is re-radiated by the sample and detected with a suitable receiving coil. In most modern instruments, this signal is detected by the rf irradiation coil, which serves in such instruments in a duplex mode as both transmitter and receiver.

In typical NMR instruments the rf coil is a cylindrical solenoidal coil which surrounds a small sample. In TMR applications, however, the object to be analyzed is ordinarily large and the rf coil must necessarily be located outside the object. Accordingly, remote sensing rf coils have been sought which can be placed against the exterior surface of a sample object and selectively project an alternating magnetic field into the interior of the object, and which can further operate to detect the induced rf signal, all within the spatial confines imposed by the shape of the external electromagnet. Remote sensing studies to date have employed what is known as a surface coil, or pancake coil, which is a planar multi-turn coil that is placed flat against the surface of an object.

There are several disadvantages associated with such a planar surface coil. First, the surface coil generates a large amount of undesirable rf electric field in addition to the rf magnetic field. The electric field is undesirable because it induces dielectric as well as ohmic heating of the sample, which must be avoided, particularly in human and other living subjects. Further, a large rf electric field can present an electrical shock hazard.

Additionally, the surface coil is not very efficient in producing a deeply penetrating rf magnetic field because the rf field is shaped such that its strength diminishes rapidly with distance from the coil, resulting in proportionately stronger signals from regions near the coil and weaker signals from regions deeper in the sample. Another disadvantage is that the rf field from a planar surface coil projects in both directions from the plane of the coil, so that the strength and shape of the field projected into the sample is affected by any metal components located behind the surface coil, such as the magnet polepieces, the magnet dewars in a liquid-helium-cooled superconducting magnet, or other components of the NMR spectrometer. Also, nearby metal objects may cause noise in the signal received by the rf coil.

SUMMARY OF THE INVENTION

Accordingly, it is an object and purpose of the present invention to provide an improved NMR apparatus for use in topical magnetic resonance spectroscopy and NMR imaging, wherein the improvement comprises an rf coil that is capable of projecting an alternating magnetic field into an article from a location outside the article. It is also an object to provide such an rf coil which produces a minimum of rf electric field, thereby minimizing adverse dielectric heating effects on the sample object.

It is also an object of the present invention to provide, for use in an NMR spectrometer, an improved rf coil that projects an rf magnetic field at a distance from the coil, the intensity and shape of which are largely free of adverse effects from nearby metallic components.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects, and in accordance with the purposes of the present invention as embodied and broadly described herein, the present invention provides an improved NMR apparatus in which the improvement comprises an rf coil having a shape that is topologically equivalent to that of a truncated toroid, or semitoroid, and including open ends from which an alternating magnetic field may be projected. In application, the truncated ends of the semitoroidal coil are placed adjacent to or flush against the surface of an object to be studied. The semitoroidal rf coil produces an rf magnetic field that is projected into the interior of the object to a depth which is on the order of the diameter of the semitoroidal coil.

The semitoroidal rf coil is relatively insensitive to metallic objects located behind the coil, since the component of the rf magnetic field located behind the plane of the open coil ends is contained substantially within the confines of the semitoroid, where it is effectively shielded from effects of any nearby metallic objects.

The semitoroidal rf coil can be made relatively insensitive to NMR signals from those regions of the sample closest to the coil, i.e., close to the surface of the object, by orienting the coil so that the axis of the static magnetic field extends parallel to the two-fold rotation symmetry axis of the coil. Since the nuclear magnetic resonance effect is proportional to the intensity of the component of the rf magnetic field extending perpendicular to the axis of the static magnetic field, NMR signals produced in the sample object near the ends of the semitoroid, where the rf magnetic field is approximately parallel to the static magnetic field, are attenuated. The effective region from which an NMR signal is obtained with such an arrangement is a volume centered about the aforementioned two-fold symmetry axis and extending some distance away from the open ends of the coil. This effective region is more distinctly defined than the effective region of signal generation for the previously known planar surface coils or, for that matter, for the semitoroid with the magnetic fields arranged in any other way.

In accordance with another aspect of the invention, a small semitoroidal shim coil can be nested concentrically inside the semitoroidal rf coil. The shim coil is wound in the direction opposite to that of the rf coil (or, alternatively, the coil is wound in the same direction and the current flow is in the opposite direction) so as to produce an rf magnetic shim field which counteracts and partially cancels the primary rf field at short distances. At greater distances the primary rf field is relatively unaffected by the field from the shim coil. With such an arrangement the effective volume of signal generation within the sample is even more narrowly defined and is located at a distance from the coil. The useful rf signal is thus concentrated at a distance from the nested pair of coils so that there can be obtained an NMR signal from an isolated region at some distance from the surface within a living animal.

In accordance with another aspect of the invention, the semitoroidal rf coil is employed as a decoupling coil in an NMR spectrometer. Decoupling coils are used to suppress the NMR spectrum of one class of nuclei in a sample so as to simplify and enhance the NMR spectrum of another class of nuclei in the same sample. This is done by irradiating the sample at the resonant frequency of the nuclei which are to be suppressed. For example, the carbon-13 NMR spectrum from a biological sample can be significantly simplified and enhanced by irradiating the sample with a magnetic field alternating at the resonance frequency of hydrogen, thereby suppressing the hydrogen NMR spectrum that would otherwise obscure the much weaker carbon-13 spectrum.

Previously known decoupling coils have suffered from the disadvantage of producing substantial stray electric rf fields and thereby causing dielectric heating of the sample. A semitoroidal rf coil, and in particular a split semitoroidal rf coil coupled to a grounded conductive plate, as described further below, can be used as a decoupling coil with substantially reduced dielectric heating.

These and other aspects of the present invention will be apparent to one of ordinary skill in the art upon consideration of the more detailed description of the invention set forth below.

BRIEF DESCRIPTION OF THE DRAWINGS

The accompanying drawings, which are incorporated in and form a part of the specification, illustrate several embodiments of the present invention and, together with the description, serve to explain the principles of the invention. In the drawings.

DETAILED DESCRIPTION OF THE INVENTION

Figure 1:
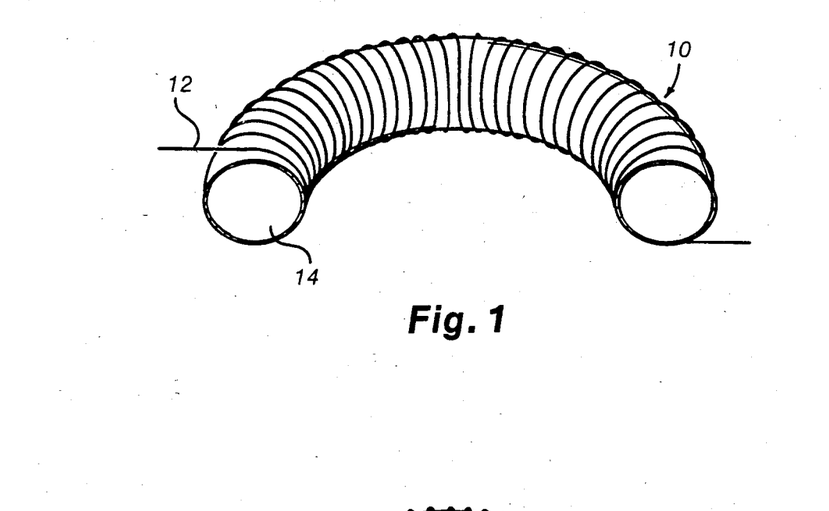
FIG. 1 is an isometric view of a semitoroidal rf coil constructed in accordance with the present invention.
Figure 2:
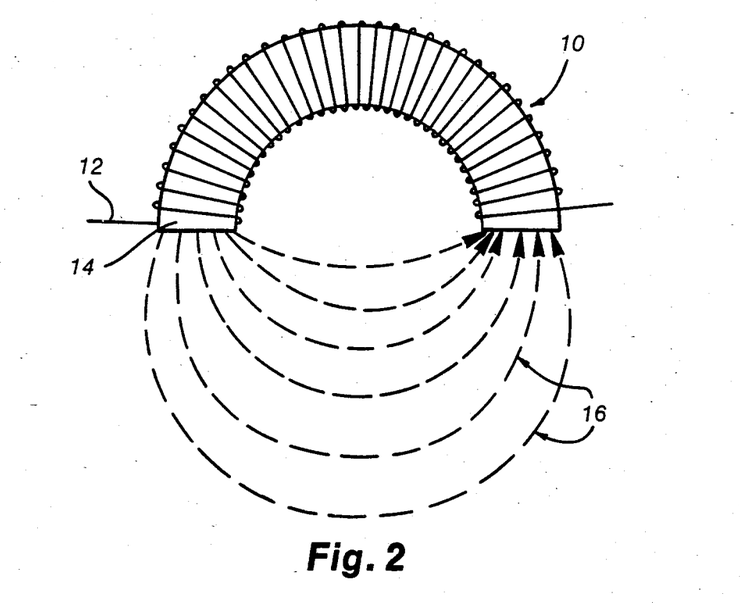
FIG. 2 is a plan view of the coil shown in FIG. 1, with field lines to illustrate the shape of the magnetic field produced by the coil.

FIGS. 1 and 2 illustrate in its simplest form a semitoroidal rf coil 10 such as might be used in an NMR spectrometer. As illustrated, the coil consists simply of an electrical conductor 12 wrapped around a semitoroidal tubular form 14. The form 14 may be constructed of any suitable dielectric material, provided the material does not contain an element to be analyzed with the spectrometer and does not have a significant dielectric absorption at the operating frequency of the coil. Under certain conditions, the form 14 may be omitted if the coil itself can be constructed with a conductor that has sufficient structural rigidity to maintain its shape during ordinary use.

It should be understood that the shape of the rf coil need not be that of a perfect semitoroid. Other similar shapes which are topologically equivalent may be equally or more suitable, depending on circumstances.

FIG. 2 includes magnetic field lines 16 which indicate the general shape of the magnetic field produced by the coil 10. As indicated, the field emerges from one end of the coil and returns to the other end. The complete field may be described as consisting of two portions—a first, or internal, portion which is enclosed entirely within the tubular confines of the coil 10; and a second, or external portion which is external to the coil and which emerges from and returns through the open ends of the coil in the manner shown. It is the latter portion of the field that is useful in the NMR applications described below.

Figure 3:
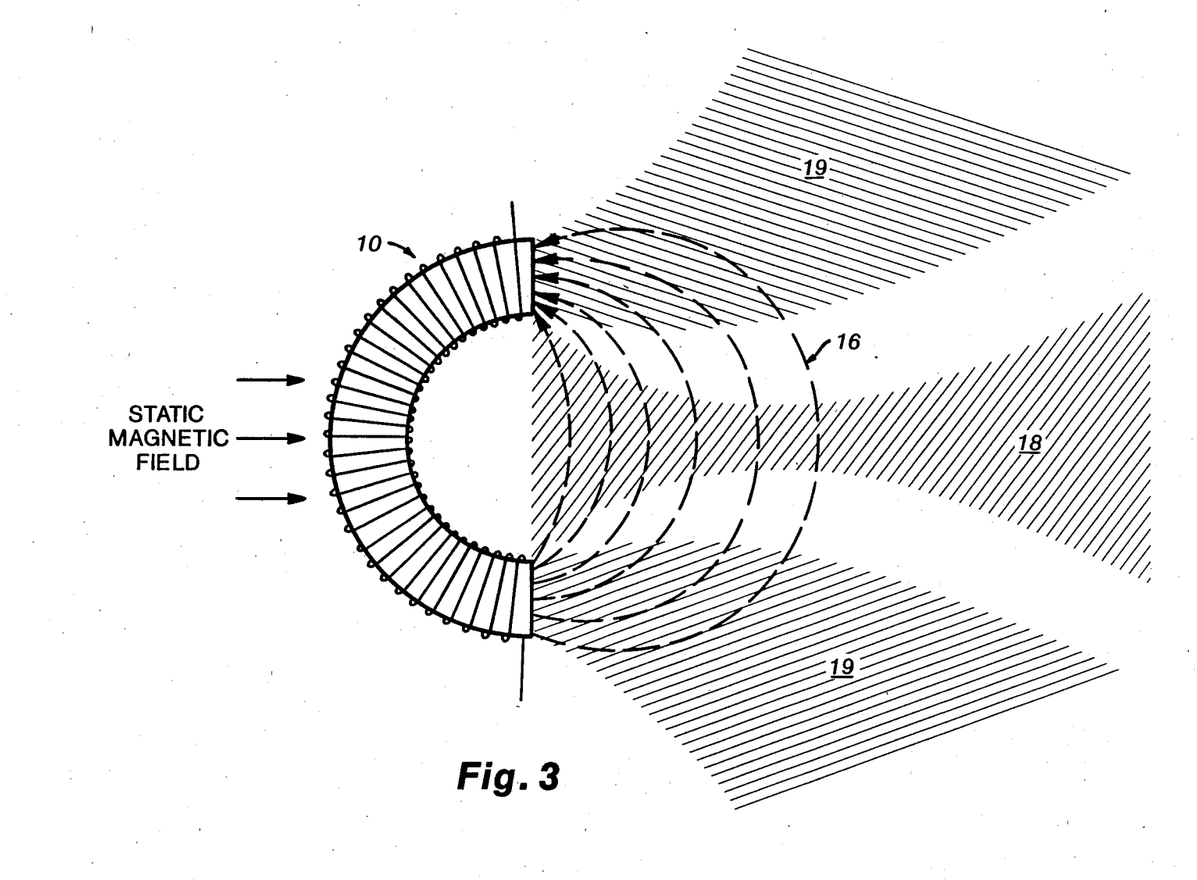
FIG. 3 is schematic view of a semitoroidal coil as in FIGS. 1 and 2, oriented with its two-fold symmetry axis parallel to an external static magnetic field, and illustrating regions of different sensitivities.

FIG. 3 illustrates the relationship between the magnetic field of the semitoroidal rf coil 10, as indicated by the field lines 16, and a static, homogenous magnetic field which extends parallel to the two-fold symmetry axis of the coil. NMR signals are most effectively obtained from regions in which the magnetic field produced by the coil is approximately perpendicular to the static field. These regions are designated by the cross-hatched areas 18 of FIG. 3. As indicated, such regions define a horn-shaped volume which generally extends along the two-fold symmetry axis of the coil. The intensity of the rf magnetic field decreases with distance from the rf coil, however, so that the portion of the region 18 closest to the rf coil is most effective in producing NMR signals.

Conversely, NMR signals are least effectively obtained from regions in which the static field and the rf coil field are approximately parallel, which are indicated as two cross-hatched regions 19 extending outwardly and away from the end faces of the coil.

Figure 4:
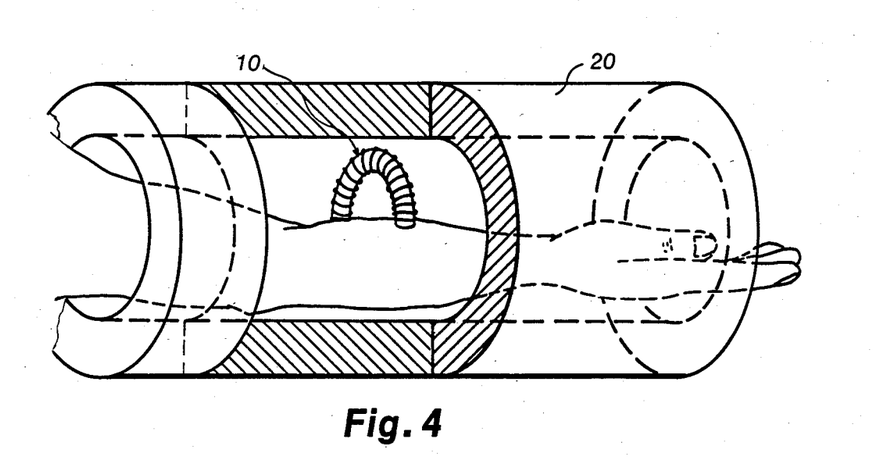
FIG. 4 a pictorial isometric view illustrating how a semitoroidal rf coil such as that shown in FIGS. 1 and 2 may be employed in the bore of a solenoidal superconducting magnet to obtain an NMR signal from tissue inside the arm of a human subject, with a portion of the electromagnet removed for purposes of illustration.
Figure 5:
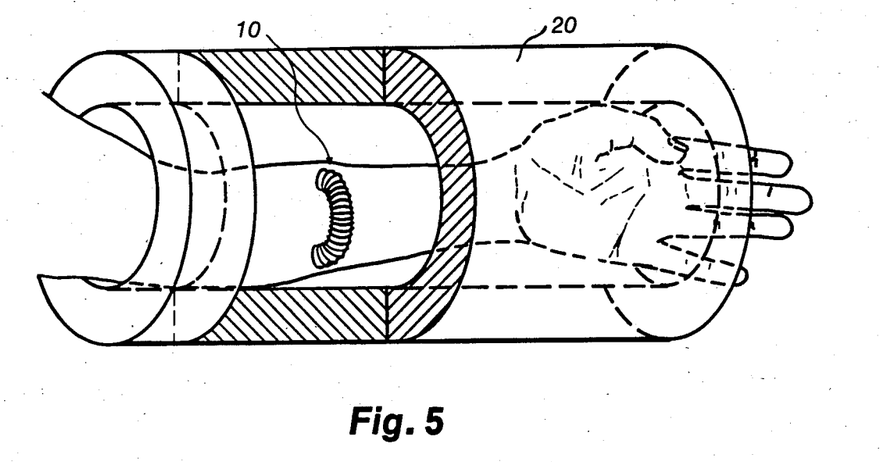
FIG. 5 is another isometric view of the semitoroidal rf coil and superconducting NMR electromagnet shown in FIG. 4.

FIGS. 4 and 5 illustrate how a semitoroidal rf coil 10 such as that shown in FIGS. 1 and 2 might be used in the bore of a large superconducting NMR magnet 20 to obtain TMR measurements from tissue inside the forearm of a human subject. In the illustrated system, the sizes of both the bore of the magnet and the rf coil are selected so as to permit a person to insert his or her arm into the bore of the magnet and place the forearm in close proximity to or in contact with the open ends of the coil 10.

Further, the coil 10 of FIGS. 4 and 5 is oriented such that it lies in a plane extending perpendicular to the static magnetic field (which extends along the bore of the magnet), in contrast to the orientation shown in FIG. 3. With such an orientation, most of the magnetic field produced by the coil is perpendicular to the static magnetic field, thus making the coil sensitive to a greater volume of the sample. This orientation is desirable where it is merely sought to obtain a signal from a relatively homogenous sample object, without regard to distinguishing among signals obtained from different locations within the object.

Another possible configuration is one in which the plane of the semitoroid is parallel to the static field lines and the two-fold axis of symmetry is perpendicular to the static field. This configuration obtains maximum sensitivity in regions near the ends of the semitoroidal coil and minimum sensitivity away from the ends. Appropriate comparison of signals from the various orientations of the coil relative to the static field enables one to differentiate signals obtained from portions of the sample which are close to the coil from portions which are deeper within the sample.

As noted above, the effective magnetic field generated by the semitoroidal coil can be described as consisting of two parts; namely, that portion existing inside the tubular semitoroid, and that portion which is external to the toroid and which penetrates a sample such as the forearm illustrated in FIGS. 3 and 4. The portion of the magnetic field contained inside the semitoroid is effectively isolated from the effects of nearby metallic objects, for example the inner surface of the superconducting magnet. As a result, the portions of the rf magnetic field inside the coil as well as outside the coil are largely unaffected by the proximity of the metallic surface behind the coil. This isolation of the rf magnetic field represents a substantial improvement over previously known rf coils, which are susceptible to the effects of nearby metallic objects. In this regard, it is noted that anything which affects the unused portion of the magnetic field also affects the shape and strength of the used portion, thereby affecting the performance of the instrument.

Figure 6:
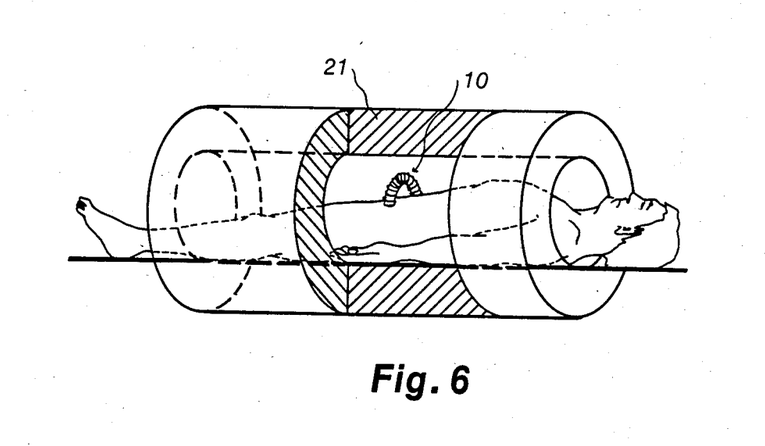
FIG. 6 is a pictorial illustration of how a semitoroidal rf field coil such as that shown in FIGS. 1 and 2 might be used in an even larger superconducting NMR magnet to obtain diagnostic NMR signals from tissue deep inside a human subject, with part of the electromagnet removed for purposes of illustration.

FIG. 6 illustrates another application of the invention which is similar to that shown in FIGS. 4 and 5, but on a larger scale. In this application a semitoroidal rf coil 10 is used in combination with a very large superconducting NMR electromagnet 21 to obtain diagnostic NMR measurements from tissue inside the abdomen of a human subject. Again, as with the embodiment described above, the sizes of the superconducting electromagnet and the semitoroidal rf coil are selected so as to obtain an optimum configuration for a person of ordinary size.

Figure 7:
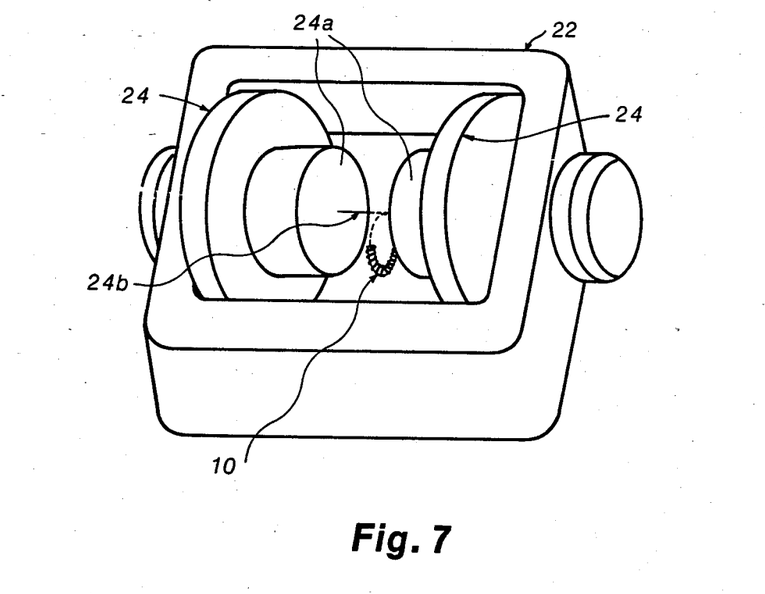
FIG. 7 is an isometric illustration of a semitoroidal rf coil, such as that shown in FIGS. 1 and 2, positioned between the polepieces of a conventional iron core NMR electromagnet.

FIG. 7 illustrates an application of the present invention in an NMR spectrometer having a conventional iron core electromagnet 22 consisting of a pair of spaced magnet coils 24 and associated iron polepieces 24a. A semitoroidal rf coil 10 is positioned between the polepieces 24a of the electromagnet. In the illustrated embodiment, the rf coil is centered between the polepieces and is positioned such that it lies orthogonal to a longitudinal central axis 24b extending through the polepieces. Further, the rf coil is preferably offset from the axis 24b of the polepieces, such that the effective rf field from the semitoroidal coil is located at a central point on the axis 24b midway between the polepieces, where the magnetic field from the NMR electromagnet is most uniform.

Figure 8:
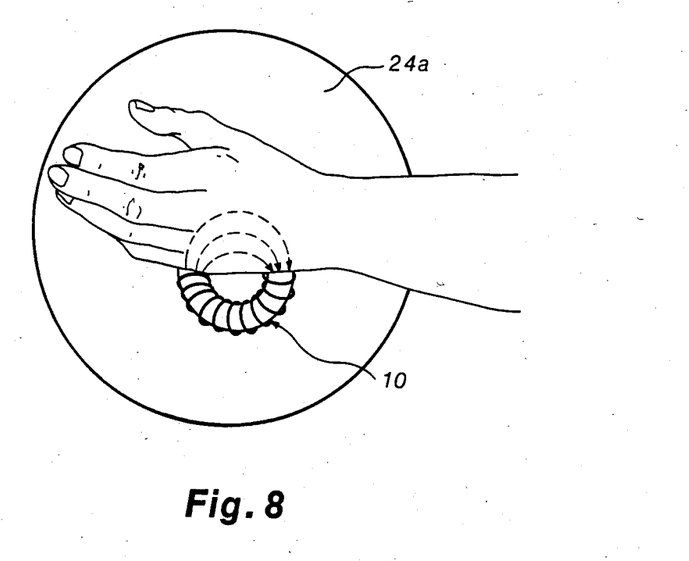
FIG. 8 is a side elevation view of the NMR system shown in FIG. 7, illustrating how an NMR signal might be obtained from tissue inside a person's hand placed between the polepieces of the NMR electromagnet.

FIG. 8 illustrates a use of the arrangement shown in FIG. 7. A person's hand is inserted between the polepieces 24a and placed edgewise against the faces of the semitoroidal coil 10. In this manner, an NMR measurement is obtained from tissue deep inside the person's hand. With an actual prototype semitoroidal coil having an overall dimension of 5 cm and a cross-section 1.5×1.5 cm arranged in this manner, the single-shot proton NMR signal from an adult human hand at 5 cm distance and at a frequency of 10 MHz has a signal-to-noise ratio of about 10. This type of application, because of its simplicity of use, is particularly suited to diagnostic applications requiring quick biochemical or physiochemical determinations, particularly where such determinations need not be obtained from any particular part of a person's body.

Figure 9:
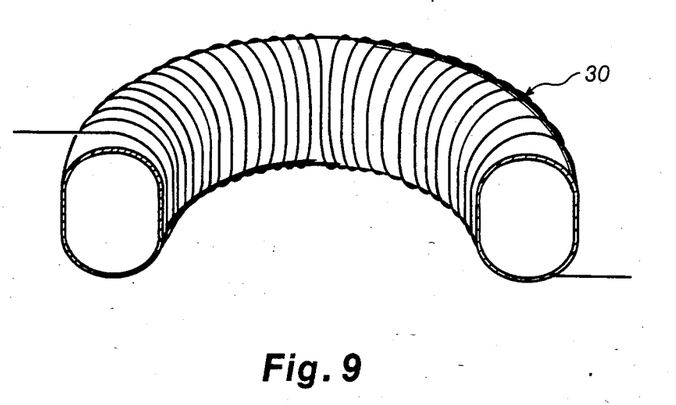
FIG. 9 is an isometric illustration of an alternative embodiment of the semitoroidal rf coil of FIGS. 1 and 2, wherein the open ends of the semitoroidal coil are flattened in directions radial to the coil.
Figure 10:
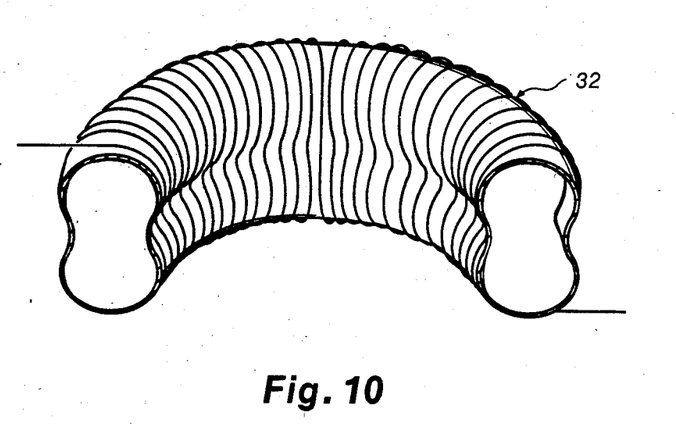
FIG. 10 is an isometric view of another alternative embodiment of the semitoroidal rf coil shown in FIGS. 1 and 2, wherein the open ends of the semitoroidal coil are pinched in directions radial to the circumference of the coil.

FIGS. 9 and 10 illustrate certain modifications of the basic semitoroidal rf coil. In FIG. 9, the open ends of a semitoroidal coil 30 are flattened, as by compressing the open ends in directions radial to the coil. This shapes the magnetic field so as to improve the homogeneity of the field in the direction perpendicular to the plane of the semitoroid. However, the major portion of the semitoroid is circular in cross-section to maximize the quality factor of the coil and therefore the intensity of the field produced.

FIG. 10 illustrates a coil 32 which is flattened and pinched at its open ends to further improve the field homogeneity in the direction parallel to the plane of the semitoroid. One can visualize this effect by considering a case where the elongation was carried out to the point such that the coil has been split into two coils. Then, clearly there would be a region between the coils where the field is a relative minimum. The minimum can be raised to be a flat dependence, i.e., uniform field, by a judicious adjustment of the effective distance between the coils.

Figure 11:
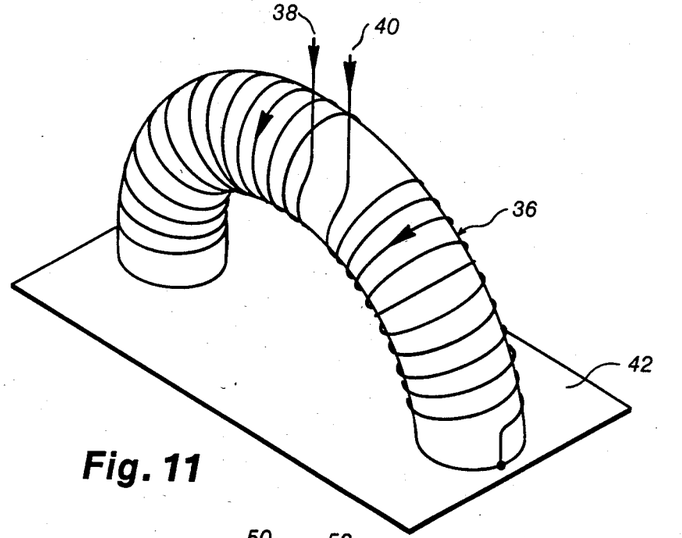
FIG. 11 is an isometric illustration of another alternative embodiment of the semitoroidal rf coil of the present invention, wherein the semitoroidal form is wound with two coil windings in parallel, with the sense of the windings opposed to each other, and with the far end of each coil winding connected to a grounded conductive plate which includes openings centered on the faces of the coil.

FIG. 11 illustrates another embodiment in which a coil 36 includes two coil windings 38 and 40. The windings 38 and 40 are driven from a common central point and are reversed in direction. Further, the windings 38 and 40 are connected to an electrically conductive grounded plate 42. The grounded plate 42 includes circular openings (not shown) which coincide with the openings of the semitoroidal coil 36. With this configuration, the sample is not exposed to any stray electric field that may arise due to voltage differences across the ends of the coil, since the ends of the coil are maintained at the same electrical potential. The apparatus is used simply by placing the grounded plate against an object, such as a part of a person's body, in the same manner as in the applications described above.

The configuration shown in FIG. 11 renders the apparatus safer in clinical applications, because there is no direct shock hazard from the ends of the coil. Additionally, dielectric heating of a sample due to stray rf electric field is minimized. This advantage also has important ramifications for the use of the coil as a decoupling coil for the second irradiation in a double resonance experiment. For example, in order to obtain NMR signals from carbon-13 nuclei, it is usually necessary to continuously irradiate the protons at their resonant frequency in order to decouple the effect of the protons on the carbon-13 resonance. Because of the high proton frequency as well as the large duty cycle of irradiation, this proton irradiation readily heats living tissue unless the rf electric field accompanying the rf magnetic field can be suppressed. Another advantage is that the signal-to-noise ratio is not adversely affected by the coupling of the dielectric noise to the coil. The signal-to-noise ratio can be improved even more over a coil with identical dimensions because the parallel electrical connections permit a larger number of turns for the same inductance. Finally, the tuning parameters are less affected by the electric field interaction of the sample with the coil, thus simplifying the operation of the coil.

Figure 12:
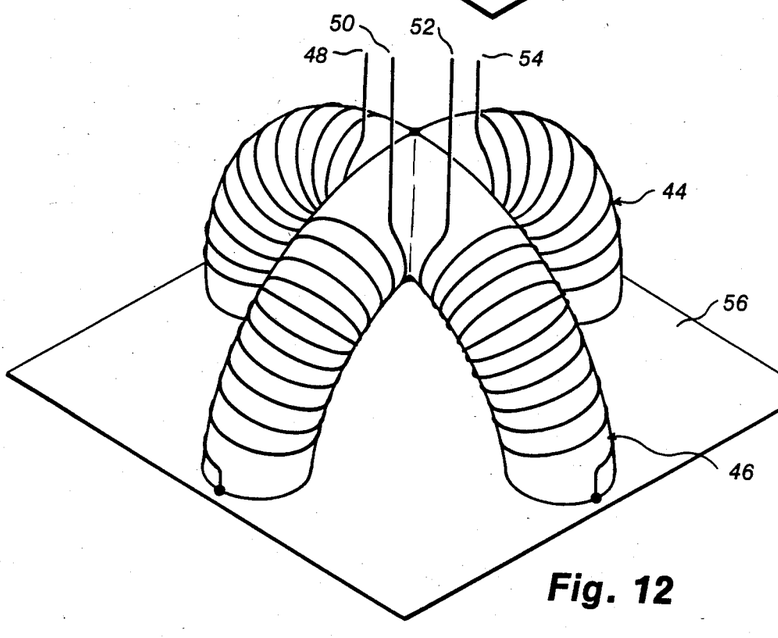
FIG. 12 illustrates a further alternative embodiment of the invention consisting of two crossed semitoroidal coils of the type illustrated in FIG. 11, with each of the four individual coil windings being connected to a common grounded plate.

For further improved performance, additional semitoroidal coils as shown in FIG. 11 may be utilized, as shown for example in FIG. 12. FIG. 12 illustrates a second semitoroid 44 placed at a right angle to a first semitoroid 46, with the coils including a total of four electrical windings 48, 50, 52 and 54. The four windings are driven from a common center at the top of the arrangement, and are each connected to a grounded plate 56. In this way, 1.4 times the field from each coil is available. In this embodiment, the two coils 44 and 46 may be driven with rf currents that are phase shifted by 90° so that the contributions from the two coils are added constructively to yield a circularly polarized rf field.

Figure 13:
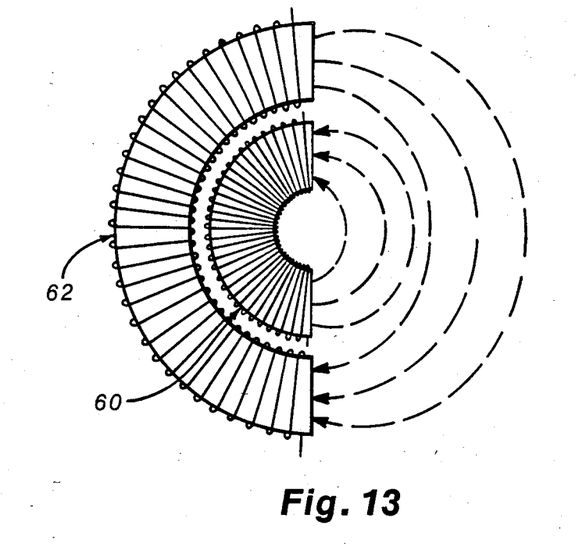
FIG. 13 illustrates another alternative embodiment of the invention, which utilizes a small, oppositely wound shim coil nested concentrically inside a primary semitoroidal rf coil.
Figure 14:
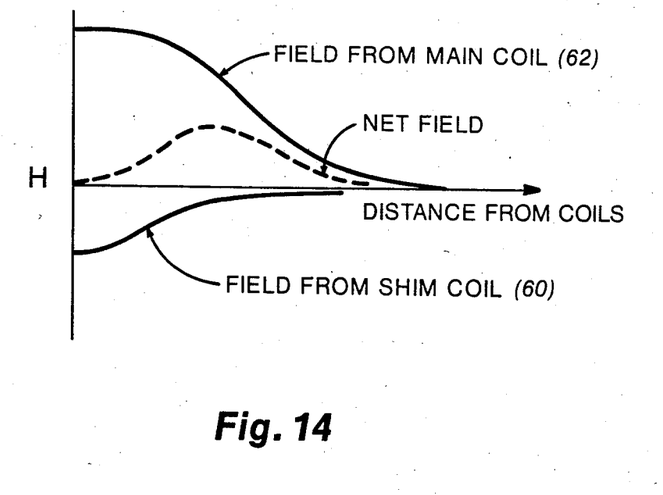
FIG. 14 is a graphical representation of the net magnetic field strength as a function of distance away from the shimmed semitoroidal rf coil of FIG. 13.

FIG. 13 illustrates the use of a shim coil 60 to further enhance the performance of a semitoroidal primary rf coil. The shim coil 60 consists of a small semitoroidal rf coil which is nested concentrically inside the primary rf coil 62. The shim coil 60 is driven with an rf electrical current so as to produce a counteracting rf magnetic field. The field from the shim coil 60 is adjusted to partially cancel the field from the primary coil 62 at some distance close to the common center plane of the coils. At greater distances, however, the field of the shim coil is weaker and has less effect, such that the effective magnetic field from the primary coil 62 is located at a distance from the common plane. The effect of the shim coil is further illustrated in FIG. 14, which indicates graphically how the field from the shim coil and the field from the primary coil cancel one another at close distances, leaving a net field which is greatest at a distance from the assembly.

Figure 15:
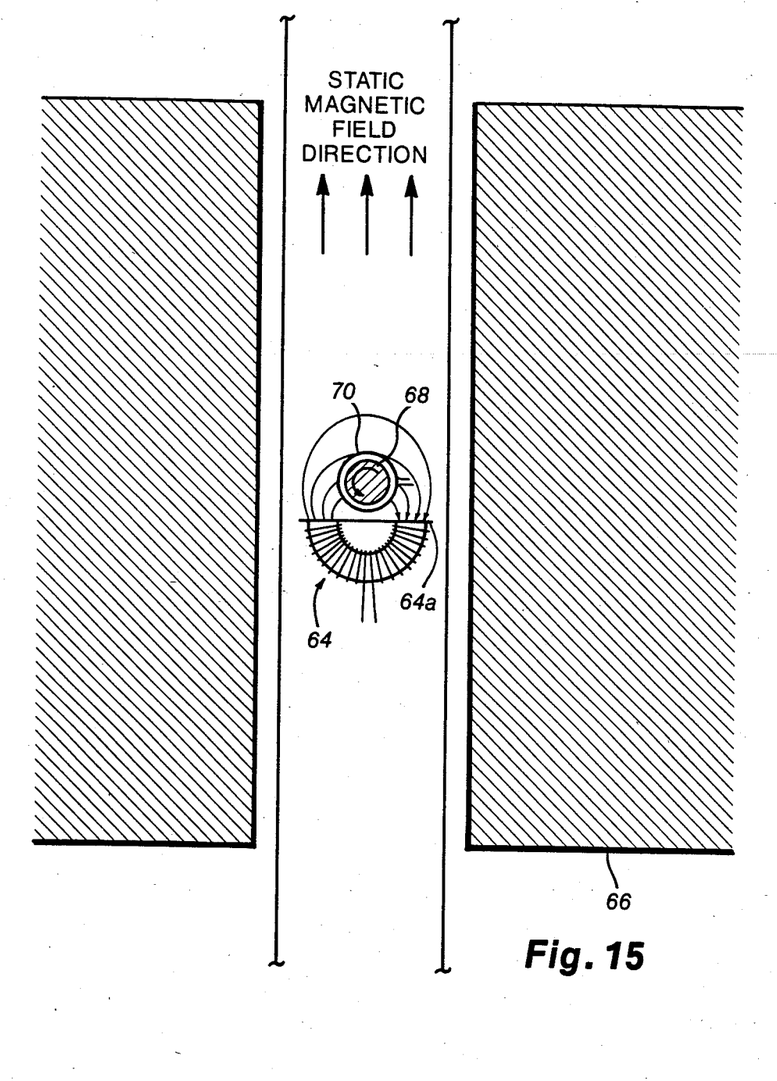
FIG. 15 illustrates the use of a semitoroidal coil as a decoupling coil in an otherwise conventional superconducting NMR spectrometer.

FIG. 15 illustrates the use of a semitoroidal rf coil 64 as a decoupling coil in the ambient temperature bore of a superconducting magnet 66. A sample 68 is enclosed in a conventional solenoidal rf coil 70 and is rotated about a horizontal axis that extends perpendicular to the axis of two-fold symmetry of the semitoroidal decoupling coil 64. Although the primary rf coil 70 is illustrated as being a conventional solenoidal coil, it should be understood that both the primary and decoupling coils could be semitoroidal. The decoupling coil 64 of FIG. 15 includes split windings of the type shown in FIG. 11, and also includes a ground plate 64a to minimize stray electric field and minimize dielectric heating of the sample.

The foregoing description of various embodiments of the invention has been presented for purposes of illustration and description. It is not intended to be exhaustive or to limit the invention to the precise forms disclosed, and there are various modifications, substitutions and alterations that will be apparent to one of ordinary skill in the art in view of the above teaching. The embodiments disclosed were chosen and described in order to best explain the principles of the invention and its practical application so as to thereby enable others skilled in the art to best utilize the invention in various embodiments and with various modifications as are suited to the particular use contemplated. It is intended that the scope of the invention be defined by the claims appended hereto.

What is claimed is:

1. In a nuclear magnetic resonance (NMR) spectrometer, the improvement comprising a semitoroidal primary radio-frequency (rf) coil for irradiating a sample with an alternating magnetic field.

2. The improvement defined in claim 1 wherein said semitoroidal rf coil has a two-fold axis of symmetry and wherein said spectrometer has a static magnetic field, and wherein said two-fold axis of symmetry extends parallel to the direction of the static magnetic field of the NMR spectrometer.

3. The improvement defined in claim 1 further comprising a semitoroidal shim coil nested concentrically inside said primary coil, and wherein said primary and shim coils are wound in opposite directions such that the rf magnetic field of the shim coil partially cancels the field of the primary coil at close distances, thereby enabling the acquisition of an NMR signal from an isolated region at depth within a sample.

4. The improvement defined in claim 1 wherein said coil includes a plurality of semitoroidal coils, each having an axis of two-fold symmetry, and wherein said axes of two-fold symmetry extend parallel to one another and are coaxial.

5. The improvement defined in claim 1 wherein said semitoroidal rf coil is flattened in directions radial to the coil.

6. The improvement defined in claim 1 wherein said semitoroidal rf coil is pinched in directions radial to the coil.

7. The improvement defined in claim 1 wherein said semitoroidal rf coil includes two coil windings which are wound in opposite directions.

8. The improvement defined in claim 7 further comprising a ground plate, and wherein the faces of the coil open through openings in said ground plate, and wherein each of the two coil windings is electrically connected at one end to said ground plate.

9. The improvement defined in claim 1 wherein said semitoroidal rf coil is operable in a duplex mode to alternately irradiate a sample and receive the induced NMR signal from the sample.

10. In a nuclear magnetic resonance (NMR) spectrometer, the improvement comprising a semitoroidal decoupling radio-frequency (rf) coil for irradiating a sample with an alternating magnetic field.

11. The improvement defined in claim 10 wherein said semitoroidal rf decoupling coil has a two-fold axis of symmetry and wherein said spectrometer has a static magnetic field, and wherein said two-fold axis of symmetry of said decoupling coil extends parallel to the direction of the static magnetic field of the NMR spectrometer.

12. The improvement defined in claim 10 wherein said decoupling coil includes a grounded plate for minimizing stray rf electric field, and wherein the faces of said coil open through openings in said ground plate.

13. The improvement defined in claim 10 wherein said semitoroidal decoupling coil includes two coil windings wound in opposite directions.

14. The improvement defined in claim 12 wherein said semitoroidal decoupling coil includes two coil windings wound in opposite directions, and wherein each of said two coil windings is electrically connected at one end to said grounded plate.

15. A nuclear magnetic resonance (NMR) apparatus comprising a magnet for generating a substantially homogenous static magnetic field, and a semitoroidal radio-frequency (rf) primary coil for irradiating a sample positioned in said static magnetic field with an alternating magnetic field.

16. The NMR apparatus defined in claim 15 wherein said semitoroidal rf primary coil has a two-fold axis of symmetry and wherein said spectrometer has a static magnetic field, and wherein said two-fold axis of symmetry extends parallel to the direction of the static magnetic field of the NMR spectrometer.

17. The NMR apparatus defined in claim 15 further comprising a semitoroidal shim coil nested concentrically inside said primary coil, and wherein the rf magnetic field of the shim coil partially cancels the field of the primary coil at close distances, thereby enabling the acquisition of an NMR signal from an isolated region at depth within a sample.

18. The NMR apparatus defined in claim 15 wherein said semitoroidal rf primary coil includes two coil windings which are wound in opposite directions.

19. The NMR apparatus defined in claim 18 further comprising a grounded plate, and wherein the faces of said semitoroidal primary coil open through a pair of openings in said grounded plate, and wherein each of said two coil windings is electrically connected at one end to said grounded plate.

* * * * *